United States Patent
Chen et al.

(10) Patent No.: US 11,314,004 B2
(45) Date of Patent: Apr. 26, 2022

(54) OPTICAL FILTERS AND METHODS FOR FORMING THE SAME

(71) Applicant: VisEra Technologies Company Limited, Hsin-Chu (TW)

(72) Inventors: Yu-Jen Chen, Taoyuan (TW); Chung-Hao Lin, Keelung (TW); Shih-Liang Ku, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 337 days.

(21) Appl. No.: 16/377,691

(22) Filed: Apr. 8, 2019

(65) Prior Publication Data

US 2020/0319386 A1 Oct. 8, 2020

(51) Int. Cl.
*G02B 5/20* (2006.01)
*H01J 37/34* (2006.01)
(Continued)

(52) U.S. Cl.
CPC .......... *G02B 5/208* (2013.01); *C03C 17/3482* (2013.01); *H01J 37/32449* (2013.01);
(Continued)

(58) Field of Classification Search
CPC .......... G02B 5/20; G02B 5/207; G02B 5/208; G02B 5/28; G02B 5/281; G02B 5/284; G02B 5/285
See application file for complete search history.

(56) References Cited

U.S. PATENT DOCUMENTS 9,989,684 B2 * 6/2018 Sprague .............. C23C 14/0652
10,782,460 B2 * 9/2020 Ockenfuss ............. G02B 5/281
(Continued)

FOREIGN PATENT DOCUMENTS

CN    1584635 A    2/2005
CN  101435888 A    5/2009
(Continued)

OTHER PUBLICATIONS

Green, Martin A. "Self-consistent optical parameters of intrinsic silicon at 300 K including temperature coefficients." Solar Energy Materials and Solar Cells 92.11 (2008): 1305-1310. (Year: 2008).*
(Continued)

*Primary Examiner* — Christopher Stanford
(74) *Attorney, Agent, or Firm* — Muncy, Geissler, Olds & Lowe, P.C.

(57) ABSTRACT

An optical filter and a method for forming the same are provided. The optical filter includes a substrate and a plurality of filter stacks formed on the substrate. Each of the plurality of filter stacks includes a higher-refractive-index layer, a medium-refractive-index layer, and a lower-refractive-index layer. The higher-refractive-index layer has a first refractive index of higher than 3.5. The medium-refractive-index layer is disposed on the higher-refractive-index layer. The medium-refractive-index layer has a second refractive index higher than 2.9 and lower than the first refractive index. The lower-refractive-index layer is disposed on the medium-refractive-index layer. The lower-refractive-index layer has a third refractive index lower than the second refractive index.

19 Claims, 6 Drawing Sheets

(51) Int. Cl.
*H01J 37/32* (2006.01)
*C03C 17/34* (2006.01)
*G02B 5/28* (2006.01)

(52) U.S. Cl.
CPC .... *H01J 37/3426* (2013.01); *C03C 2217/213* (2013.01); *C03C 2217/28* (2013.01); *C03C 2217/70* (2013.01); *C03C 2218/155* (2013.01); *G02B 5/285* (2013.01); *H01J 2237/332* (2013.01)

(56) References Cited

U.S. PATENT DOCUMENTS

| | | | |
|---|---|---|---|
| 2006/0055308 A1 | 3/2006 | Lairson et al. | |
| 2010/0328605 A1* | 12/2010 | Suzuki | C23C 14/5826 351/159.57 |
| 2011/0096395 A1 | 4/2011 | Bluem et al. | |
| 2012/0068450 A1 | 3/2012 | Macpherson et al. | |
| 2014/0210031 A1* | 7/2014 | Hendrix | G02B 5/281 257/432 |
| 2015/0338701 A1 | 11/2015 | Kim et al. | |
| 2016/0238759 A1* | 8/2016 | Sprague | C23C 14/3414 |
| 2017/0336544 A1* | 11/2017 | Hendrix | H04N 5/33 |
| 2018/0149781 A1* | 5/2018 | Ockenfuss | C23C 14/14 |
| 2018/0321425 A1* | 11/2018 | Hart | G02B 5/285 |
| 2019/0352222 A1* | 11/2019 | Zhang | C03C 17/36 |
| 2020/0057183 A1* | 2/2020 | Mu | G02B 5/281 |
| 2020/0209448 A1* | 7/2020 | Rowlands | C23C 14/081 |
| 2020/0365751 A1* | 11/2020 | Guo | H01L 31/022466 |
| 2021/0255377 A1* | 8/2021 | Liu | C23C 14/10 |

FOREIGN PATENT DOCUMENTS

| | | |
|---|---|---|
| CN | 101598828 A | 12/2009 |
| CN | 102650709 A | 8/2012 |
| CN | 103688195 A | 3/2014 |
| CN | 106950633 A | 7/2017 |
| CN | 107180839 A | 9/2017 |
| CN | 107209306 A | 9/2017 |
| CN | 108121026 A | 6/2018 |
| CN | 108897085 A | 11/2018 |
| CN | 108962923 A | 12/2018 |
| CN | 110737040 A | 1/2020 |
| EP | 0438646 A1 | 7/1991 |
| EP | 3462218 A1 | 3/2019 |
| JP | 2003161829 A | 6/2003 |
| TW | 528891 B | 4/2003 |
| TW | 201621354 A | 6/2016 |
| TW | 201643478 A | 12/2016 |
| TW | I576617 B | 4/2017 |
| TW | 201825872 A | 7/2018 |
| TW | I647490 B | 1/2019 |
| TW | I648561 B | 1/2019 |
| TW | M572460 U | 1/2019 |
| TW | I684031 B | 2/2020 |
| WO | WO-2020/139841 A2 | 7/2020 |

OTHER PUBLICATIONS

Office Action with search report issued in TW application No. 108126942 dated May 25, 2020.
Xiuhua et al., "Dual-Bandpass Filter in Infrared Thermal Imaging System for Methane Detection," Acta Optica Sinica, vol. 38, No. 12, Dec. 2018, 7 pages.
Office Action dated Sep. 29, 2021 in CN Application No. 201910740197.5, 9 pages.

\* cited by examiner

OPTICAL FILTERS AND METHODS FOR FORMING THE SAME

BACKGROUND

Field of the Disclosure

The present disclosure relates to an optical filter and a method for forming the same, and particularly relates to an optical filter having a passband at least partially overlapping with a wavelength range of 850 nm to 2000 nm and a method for forming the same.

Description of the Related Art

Nowadays, image sensors are widely used in many fields, as well as in devices such as light sensors, proximity sensors, time-of-flight (TOF) cameras, spectrometers, devices for spectral inspection, color filters, smart sensors used in the Internet of things (IOT), and sensors for advanced driver assistance systems (ADAS). In order to provide improved sensitivity as well as a satisfactory signal-to-noise ratio, narrow bandpass filters are components that are essential in realizing these applications.

Although existing narrow bandpass filters have been adequate for their intended purposes, they have not been entirely satisfactory in all respects. Therefore, there are still some problems with narrow bandpass filters that remain to be overcome.

BRIEF SUMMARY

The present disclosure relates to an optical filter and a method for forming the same. In the embodiments, with the design of the filter stacks each including a higher-refractive-index layer, a medium-refractive-index layer, and a lower-refractive-index layer, the optical filter of the present disclosure can be provided with low angle dependency and steep filter edges between the passband and the blockband. In addition, there are at least three layers, each of which has its own designed refractive index, in each of the filter stacks in accordance with the embodiments, and so the total thickness of the optical filter can be greatly reduced.

In some embodiments of the disclosure, an optical filter is provided. The optical filter includes a substrate and a plurality of filter stacks formed on the substrate. Each of the plurality of filter stacks includes a higher-refractive-index layer, a medium-refractive-index layer, and a lower-refractive-index layer. The higher-refractive-index layer has a first refractive index of higher than 3.5. The medium-refractive-index layer is disposed on the higher-refractive-index layer. The medium-refractive-index layer has a second refractive index higher than 2.9 and lower than the first refractive index. The lower-refractive-index layer is disposed on the medium-refractive-index layer. The lower-refractive-index layer has a third refractive index lower than the second refractive index.

In some embodiments of the disclosure, a method for forming an optical filter is provided. The method includes providing a substrate and forming a plurality of filter stacks on the substrate. Forming each of the plurality of filter stacks includes: forming a higher-refractive-index layer having a first refractive index of higher than 3.5; forming a medium-refractive-index layer on the higher-refractive-index layer, wherein medium-refractive-index layer has a second refractive index higher than 2.9 and lower than the first refractive index; and forming a lower-refractive-index layer on the medium-refractive-index layer, wherein the lower-refractive-index layer has a third refractive index lower than the second refractive index.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

In the embodiments of the present disclosure, with the design of the filter stacks each including a higher-refractive-index layer, a medium-refractive-index layer, and a lower-refractive-index layer, the optical filter of the present disclosure can be provided with low angle dependency and steep filter edges between the passband and the blockband. In addition, each of the at least three layers has its own designed refractive index in each of the filter stacks in accordance with the embodiments, so the total thickness of the optical filter can be greatly reduced. Details of embodiments of the present disclosure are described hereinafter with accompanying drawings. Specific structures and compositions disclosed in the embodiments are used as examples and for explaining the disclosure only and are not to be construed as limitations. A person having ordinary skill in the art may modify or change corresponding structures and compositions of the embodiments according to actual application.

Unless explicitly indicated by the description, as used herein, the singular forms "a," "an" and "the" are intended to include the plural forms as well, unless the context clearly indicates otherwise. It should be further understood that when such as the term "comprises" and/or "comprising," is used in this specification, it specifies the presence of described features, steps, elements, and/or components, but does not preclude the presence or addition of one or more other features, steps, elements, components, and/or groups thereof.

Throughout this specification, the term "one embodiment" or "an embodiment" means that a particular feature, structure, or characteristic described in connection with the embodiment is included in at least one embodiment. Thus, the phrases "in one embodiment" or "in an embodiment" in various contexts throughout this specification do not necessarily all refer to the same embodiment. Furthermore, the particular features, structures, or characteristics may be combined in any suitable manner in one or more embodiments. It should be appreciated that the following figures are not drawn to scale; rather, these figures are merely illustrations.

Figure 1:
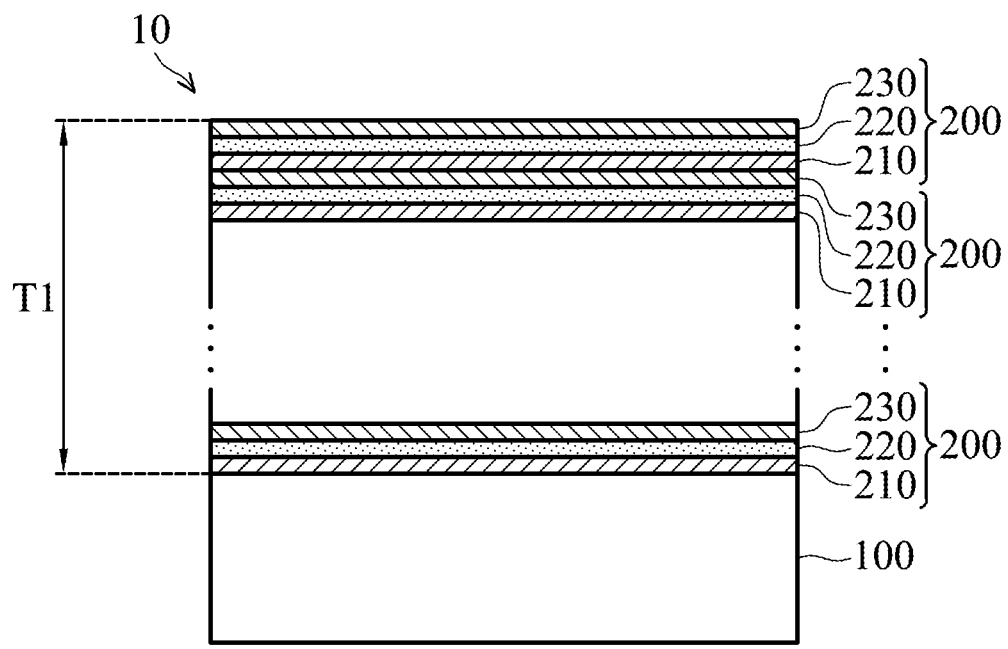
FIG. 1 is a cross-sectional view of an optical filter in accordance with some embodiments of the present disclosure.

FIG. 1 is a cross-sectional view of an optical filter 10 in accordance with some embodiments of the present disclosure. As shown in FIG. 1, the optical filter 10 has a passband at least partially overlapping with a wavelength range of about 850 nm to about 2000 nm or a wavelength range of about 850 nm to about 1550 nm, in accordance with some embodiments. The optical filter 10 includes a substrate 100 and a plurality of filter stacks 200 formed on the substrate 100. Each of the filter stacks 200 includes a higher-refractive-index layer 210, a medium-refractive-index layer 220, and a lower-refractive-index layer 230. The higher-refractive-index layer 210 has a first refractive index of higher than 3.5 at a wavelength of 940 nm. The medium-refractive-index layer 220 is disposed on the higher-refractive-index layer 210. The medium-refractive-index layer 220 has a second refractive index that is higher than 2.9 and lower than the first refractive index at a wavelength of 940 nm. The lower-refractive-index layer 230 is disposed on the medium-refractive-index layer 220. The lower-refractive-index layer 230 has a third refractive index that is lower than the second refractive index at a wavelength of 940 nm.

In some embodiments, the optical filter 10 is a narrow bandpass filter. For example, in one embodiment, the optical filter 10 is a narrow bandpass filter that is designed to transmit a light having a wavelength range of about 931 nm to about 961 nm. In another embodiment, the optical filter 10 is a narrow bandpass filter that is designed to transmit a light having a wavelength range of about 1520 nm to about 1550 nm. However, the above examples are for exemplary only and are not for limiting the scope of the present disclosure.

According to the embodiments of the present disclosure, with the design of the filter stacks 200 each including a higher-refractive-index layer 210, a medium-refractive-index layer 220, and a lower-refractive-index layer 230, the optical filter 10 of the present disclosure can be provided with low angle dependency and steep filter edges between the passband (e.g. transmittance level of 90% or greater) and the blockband (e.g. blocking level of OD3 or greater).

In addition, in accordance with the embodiments, each of the three layers has its own designed refractive index in each of the filter stacks 200, and so the total thickness of the optical filter 10 can be greatly reduced while possessing the above-mentioned satisfactory optical properties.

In some embodiments, as shown in FIG. 1, in each of the plurality of filter stacks 200, the medium-refractive-index layer 220 is disposed between the higher-refractive-index layer 210 and the lower-refractive-index layer 230, and the medium-refractive-index layer 220 is in direct contact with the higher-refractive-index layer 210 and the lower-refractive-index layer 230.

In some embodiments, the second refractive index of the medium-refractive-index layer 220 may be in a range from about 2.9 to about 3.3 at a wavelength of 940 nm.

In some embodiments, the third refractive index of the lower-refractive-index layer 230 may be lower than 1.6 at a wavelength of 940 nm.

In some embodiments, the difference between the second refractive index of the medium-refractive-index layer 220 and the third refractive index of the lower-refractive-index layer 230 is greater than the difference between the first refractive index of the higher-refractive-index layer 210 and the second refractive index of the medium-refractive-index layer 220.

In some embodiments, as shown in FIG. 1, a total thickness TI of the plurality of filter stacks 200 may be less than 5 μm. In some embodiments, the total thickness TI of the plurality of filter stacks 200 may be less than 4.7 μm.

In some embodiments, as shown in FIG. 1, the substrate 100 is in direct contact with the higher-refractive-index layer 210 of one of the plurality of filter stacks 200. In this case, as shown in FIG. 1, the substrate 100 is in direct contact with the higher-refractive-index layer 210 of the bottom-most filter stack 200. In some other embodiments, the substrate 100 may be in direct contact with the lower-refractive-index layer 230 of one of the plurality of filter stacks 200 (not shown in drawings).

In some embodiments, the higher-refractive-index layer 210, the medium-refractive-index layer 220, and the lower-refractive-index layer 230 of each of the plurality of filter stacks 200 may independently include hydrogenated silicon (SiH), niobium oxide ($N_2O_5$), titanium oxide ($TiO_2$), tantalum oxide ($Ta_2O_5$), silicon oxide ($SiO_2$), yttrium oxide ($Y_2O_3$), zirconium oxide ($ZrO_2$), aluminum oxide ($Al_2O_3$), silicon nitride (SiN), or any combination thereof.

In one embodiment, the higher-refractive-index layer 210 includes hydrogenated silicon (SiH) having a refractive index of about 3.51, the medium-refractive-index layer 220 includes hydrogenated silicon (SiH) having a refractive index of about 3.20, and the lower-refractive-index layer 230 includes silicon oxide ($SiO_2$) having a refractive index of about 1.45.

According to the embodiments of the present disclosure, hydrogenated silicon (SiH) having a desired refractive index is used as the material of the higher-refractive-index layer 210 and/or the medium-refractive-index layer 220 can provide improved low angle dependency and steep filter edges between the passband and the blockband. More specifically, with the design of the higher-refractive-index layer 210 and the medium-refractive-index layer 220 both made of hydrogenated silicon (SiH) each having its designed refractive index, the center wavelength of the passband shift (i.e. blue shift) of the optical filter can be less than 15 nm with a change of an incidence angle from 0° to under 30°. In addition, with the design described above, the transmittance of the optical filter 10 can be raised from 10% to 90% within a very small wavelength range of such as less than 10 nm. According to the embodiments of the present disclosure, the optical filter 10 has high passband transmittance, accurate center wavelength, and broadband blocking range, and thus an excellent signal-to-noise ratio can be provided.

Figure 2:
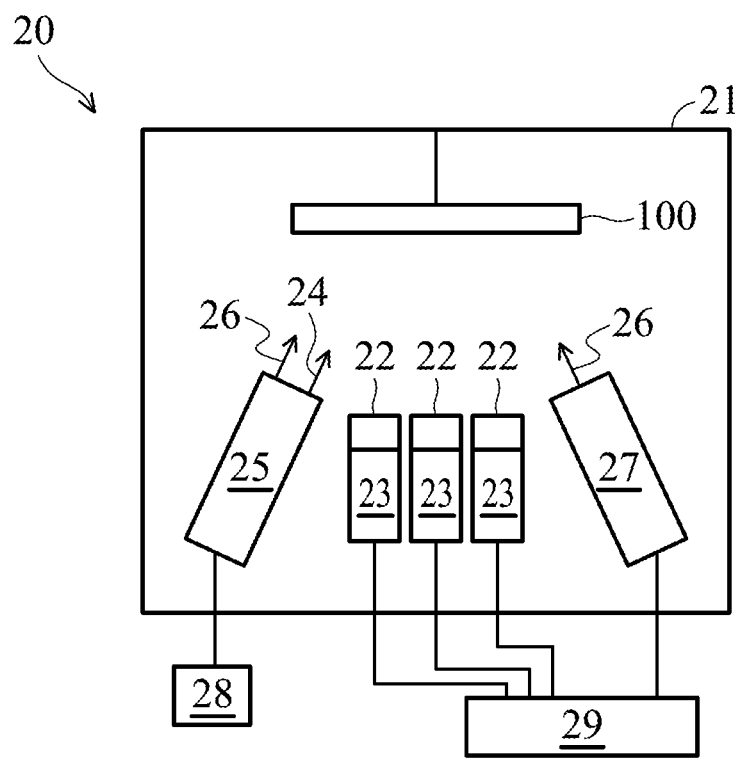
FIG. 2 is a schematic drawing of a sputter-deposition system.

FIG. 2 is a schematic drawing of a sputter-deposition system 20. The sputter-deposition system 20 as shown in FIG. 2 may be used to form an optical filter in accordance with some embodiments of the present disclosure.

As shown in FIG. 2, the sputter-deposition system 20 includes a sputtering deposition chamber 21, at least a cathode 23 (e.g. three cathodes 23 as shown in FIG. 2), a plasma activation source 25, an anode 27, a plasma power supply 28, and a cathode power supply 29. The sputtering deposition chamber 21 is a vacuum chamber, and the cathode 23, the plasma activation source 25, and the anode 27 are disposed in the sputtering deposition chamber 21. The cathode 23 is powered by the cathode power supply 29. The power activation source 25 is powered by the plasma power supply 28. A target material 22 may be provided on the cathode 23, and the target material 22 is then sputtered so as to be deposited on a substrate 100 disposed in the sputtering deposition chamber 21. In some embodiments, the power activation source 25 is an inductively coupled plasma (ICP) source.

As shown in FIG. 2, an inert gas 26 may be supplied into the sputtering deposition chamber 21. In some embodiments, the inert gas 26 may be introduced into the sputtering deposition chamber 21 through the plasma activation source 25. In some embodiments, the inert gas 26 may be further introduced through the anode 27. As shown in FIG. 2, for example, the plasma-activated reactive gas 24 may be introduced into the sputtering deposition chamber 21 through the plasma activation source 25.

FIGS. 3A-3E are cross-sectional views illustrating a process for forming an optical filter in accordance with some embodiments of the present disclosure. The following steps as shown in FIGS. 3A-3E are illustrated as performed using the sputter-deposition system 20 as shown in FIG. 2 as an example. The elements in the present embodiment sharing similar or the same labels with those in the previous embodiment are similar or the same elements, and the description of which is omitted.

Figure 3A:
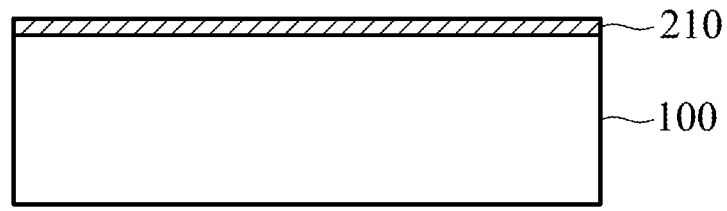
FIGS. 3A-3E are cross-sectional views illustrating a process for forming an optical filter in accordance with some embodiments of the present disclosure.

Referring to FIGS. 2 and 3A, the substrate 100 is provided. In some embodiments, the substrate 100 is a glass substrate or any suitable substrate that is substantially transparent with respect to a light having a wavelength range of about 850 nm to about 2000 nm. As shown in FIG. 2, in the embodiments, the substrate 100 is disposed in the sputtering deposition chamber 21, and the target material 22 is provided on the cathode 23 inside the sputtering deposition chamber 21.

Afterwards, according to some embodiments of the present disclosure, the formations of the higher-refractive-index layer 210, the medium-refractive-index layer 220, and the lower-refractive-index layer 230 of each of the plurality of filter stacks 200 are performed by sputtering deposition. The sputtering deposition may be performed by using the sputter-deposition system 20 as shown in FIG. 2, and the details will be discussed hereinafter.

Next, as shown in FIGS. 2 and 3A, an inert gas 26 is supplied into the sputtering deposition chamber 21, and a plasma-activated reactive gas 24 is supplied to sputter the target material 22, so as to deposit the higher-refractive-index layer 210 on the substrate 100. As shown in FIG. 3A, in some embodiments, the higher-refractive-index layer 210 is in direct contact with the substrate 100.

In some embodiments, the target material 22 provided inside the sputtering deposition chamber 21 may include niobium (Nb), titanium (Ti), tantalum (Ta), silicon (Si), yttrium (Y), zirconium (Zr), aluminum (Al), copper (Cu), amorphous silicon (α-Si), crystalline silicon (c-Si), silver (Ag), gold (Au), germanium (Ge), or any combination thereof. In some embodiments, the plasma-activated reactive gas 24 may include hydrogen or oxygen or nitrogen, or any combination thereof. In some embodiments, the inert gas 26 may include argon, helium, or any combination thereof.

In some embodiments, the target material 22 may be a silicon target, and the plasma-activated reactive gas 24 may be a plasma-activated hydrogen gas. In this case, the as-formed higher-refractive-index layer 210 may be a hydrogenated silicon (SiH) layer having a refractive index of higher than 3.5 at a wavelength of 940 nm.

In some embodiments, during the formation of the higher-refractive-index layer 210, an inert gas flow rate of the supplied inert gas 26 is about 50 sccm to about 450 sccm. In some embodiments, during the formation of the higher-refractive-index layer 210, a hydrogen gas flow rate of the supplied plasma-activated hydrogen gas for sputtering the silicon target is greater than about 0 sccm to about 150 sccm. In some embodiments, during the formation of the higher-refractive-index layer 210, a sputtering target power is about 6 kW to about 8 kW.

In one embodiment, during the formation of the higher-refractive-index layer 210 as shown in FIG. 3A, the supplied inert gas 26 is argon, the inert gas flow rate of the supplied inert gas 26 is about 225 sccm, the hydrogen gas flow rate of the supplied plasma-activated hydrogen gas is about 150 sccm, and the sputtering target power is about 8 kW.

Figure 3B:
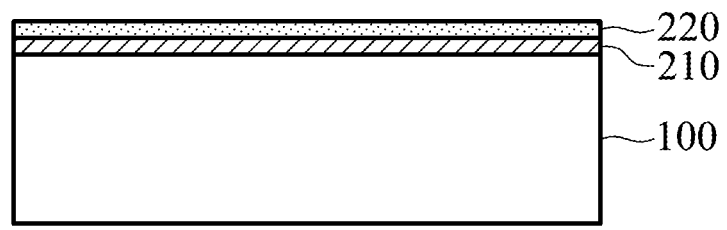

Next, as shown in FIGS. 2 and 3B, an inert gas 26 is supplied into the sputtering deposition chamber 21, and a plasma-activated reactive gas 24 is supplied to sputter the target material 22, so as to deposit the medium-refractive-index layer 220 on the higher-refractive-index layer 210. As shown in FIG. 3B, in some embodiments, the medium-refractive-index layer 220 is in direct contact with the higher-refractive-index layer 210.

In some embodiments, the target material 22, the plasma-activated reactive gas 24, and the inert gas 26 used for depositing the medium-refractive-index layer 220 may be the same as or similar to those used for depositing the higher-refractive-index layer 210.

In some embodiments, the target material 22 may be a silicon target, and the plasma-activated reactive gas 24 may be a plasma-activated hydrogen gas. In this case, the as-formed medium-refractive-index layer 220 may be a hydrogenated silicon (SiH) layer having a refractive index that is higher than 2.9 and lower than the refractive index of the higher-refractive-index layer 210 at a wavelength of 940 nm.

In one embodiments, during the formation of the medium-refractive-index layer 220 as shown in FIG. 3B, the supplied inert gas 26 is argon, the inert gas flow rate of the supplied inert gas 26 is about 170 sccm, the hydrogen gas flow rate of the supplied plasma-activated hydrogen gas is about 150 sccm, and the sputtering target power is about 6 kW.

In some embodiments, the sputtering target power for forming the higher-refractive-index layer 210 may be higher than the sputtering target power for forming the medium-refractive-index layer 220.

In some embodiments, the inert gas flow rate used in forming the higher-refractive-index layer 210 may be higher than the inert gas flow rate used in forming the medium-refractive-index layer 220.

Figure 3C:
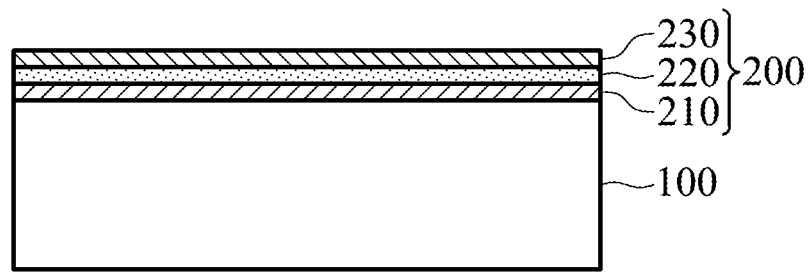

Next, as shown in FIGS. 2 and 3C, an inert gas 26 is supplied into the sputtering deposition chamber 21, and a plasma-activated reactive gas 24 is supplied to sputter the target material 22, so as to deposit the lower-refractive-index layer 230 on the medium-refractive-index layer 220. As shown in FIG. 3C, in some embodiments, the lower-refractive-index layer 230 is in direct contact with the medium-refractive-index layer 220.

In some embodiments, the target material 22, the plasma-activated reactive gas 24, and the inert gas 26 used for depositing the lower-refractive-index layer 230 may be the same as or similar to those used for depositing the higher-refractive-index layer 210 and/or the medium-refractive-index layer 220.

In some embodiments, the target material 22 may be a silicon target, and the plasma-activated reactive gas 24 may be a plasma-activated oxygen gas. In this case, the as-formed lower-refractive-index layer 230 may be a silicon oxide layer having a refractive index that is lower than the refractive index of the medium-refractive-index layer 220 at a wavelength of 940 nm.

In some embodiments, during the formation of the lower-refractive-index layer 230, an inert gas flow rate of the supplied inert gas 26 is about 50 sccm to about 450 sccm. In some embodiments, during the formation of the lower-refractive-index layer 230, the oxygen gas flow rate of the supplied plasma-activated oxygen gas is about 150 sccm to about 350 sccm. In some embodiments, during the formation of the lower-refractive-index layer 230, a sputtering target power is about 6 kW to about 8 kW.

In one embodiment, during the formation of the lower-refractive-index layer 230 as shown in FIG. 3C, the supplied inert gas 26 is argon, the inert gas flow rate of the supplied inert gas 26 is about 225 sccm, the oxygen gas flow rate of the supplied plasma-activated oxygen gas is about 150 sccm, and the sputtering target power is about 6 kW.

At this point, as shown in FIG. 3C, one of the filter stacks 200 including the higher-refractive-index layer 210, the medium-refractive-index layer 220, and the lower-refractive-index layer 230 is deposited on the substrate 100. In the embodiments as shown in FIG. 3C, the bottom-most filter stack 200 is firstly formed on the substrate 100, the higher-refractive-index layer 210 of the bottom-most filter stack 200 is in direct contact with the substrate 100, and the medium-refractive-index layer 220 is formed between and in direct contact with the higher-refractive-index layer 210 and the lower-refractive-index layer 230.

In the embodiments, the substrate 100 has a relatively low refractive index (e.g. the refractive index of glass is about 1.45), and the higher-refractive-index layer 210 has the highest refractive index among those of the three layers of the filter stack 200. Thus, there is a relatively large difference between the refractive index of the substrate 100 and the refractive index of the higher-refractive-index layer 210. According to the embodiments of the present disclosure, during the process of depositing the higher-refractive-index layer 210 of the first one of the filter stacks 200 directly on the substrate 100, because of the excellent resolution provided by the large difference between the refractive indices, it is relatively easier to observe and control the deposited thickness of the higher-refractive-index layer 210. Accordingly, the processing error may be avoided, and the control over the thicknesses of the deposited layers can be increased.

In some embodiments, referring to FIG. 2, the target materials 22 provided on different cathodes 23 may be the same or different from one another. In some embodiments, the inert gases 26 introduced for forming different layers of each of the filter stacks 200 may be the same or different from one another. In some embodiments, the plasma-activated reactive gases 24 introduced for forming different layers of each of the filter stacks 200 may be the same or different from one another.

Figure 3D:
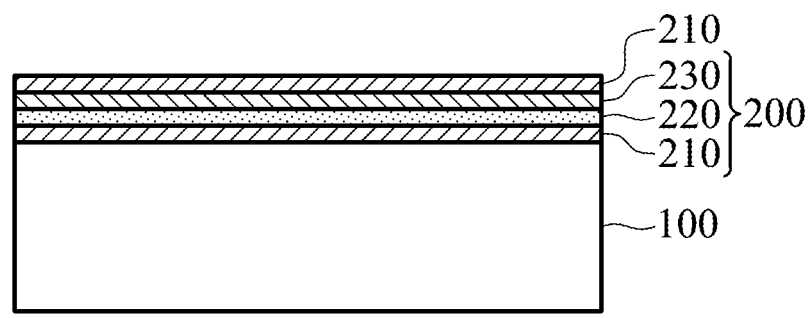
Figure 3E:
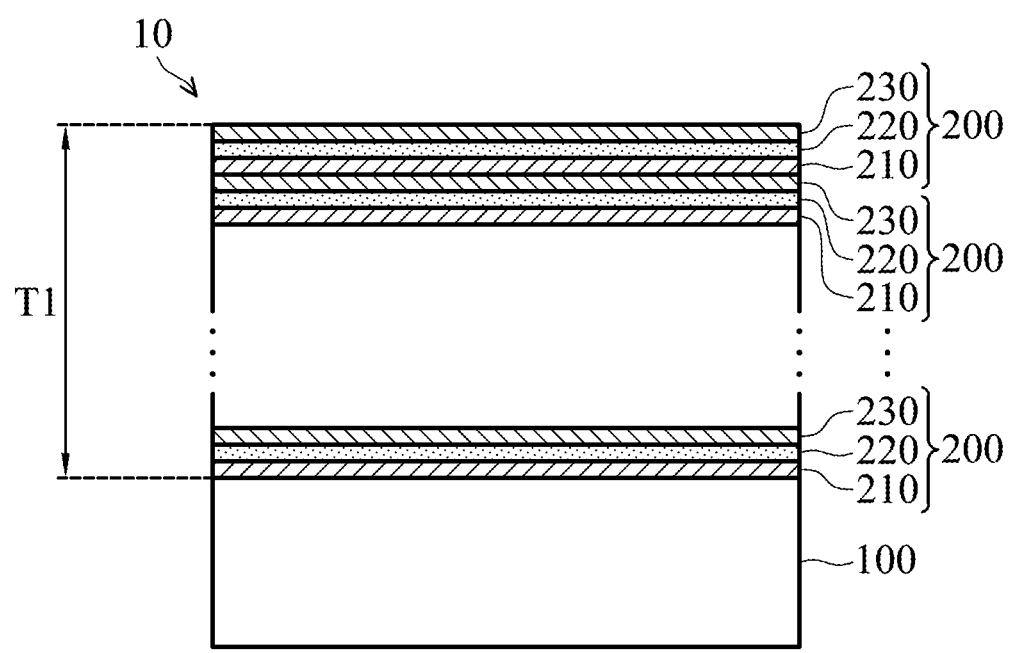

Next, as shown in FIGS. 3D and 3E, the steps illustrated in FIGS. 3A-3C are repeated multiple times to form the plurality of filter stacks 200. For example, as shown in FIG. 3D, the higher-refractive-index layer 210 of the second one of the filter stacks 200 is deposited on the lower-refractive-index layer 230 of the first one of the filter stacks 200, and then the medium-refractive-index layer 220 and the lower-refractive-index layer 230 are sequentially deposited thereon to form the second one of the filter stacks 200, so as to form the plurality of filter stacks 200 as shown in FIG. 3E.

In some embodiments, forming the higher-refractive-index layer 210, forming the medium-refractive-index layer 220, and forming the lower-refractive-index layer 230 of each of the plurality of filter stacks 200 may be performed in-situ in the same sputtering deposition chamber 21.

Figure 4:
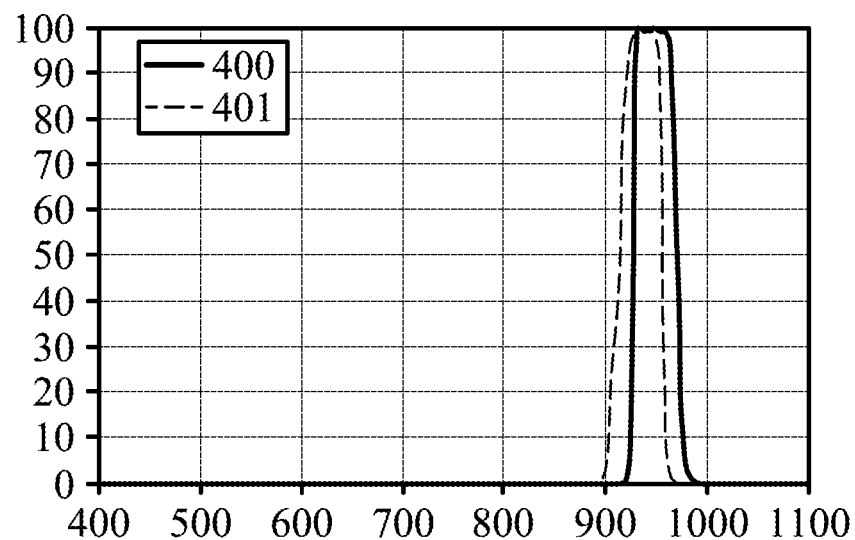
FIG. 4 shows transmittance spectra at incidence angles of 0° and 31° of an optical filter according to an embodiment of the present disclosure.
Figure 5:
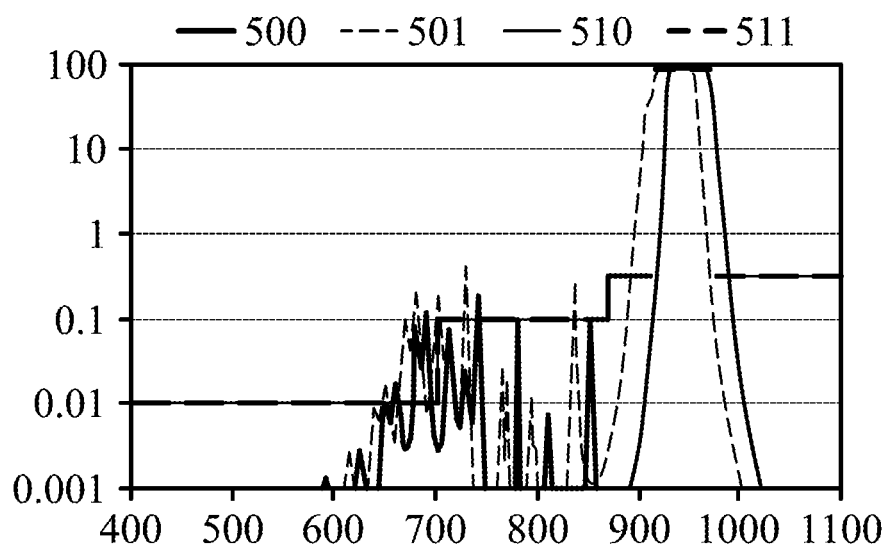
FIG. 5 shows the transmittance spectra of FIG. 4 with logarithmic y-axis.
Figure 6:
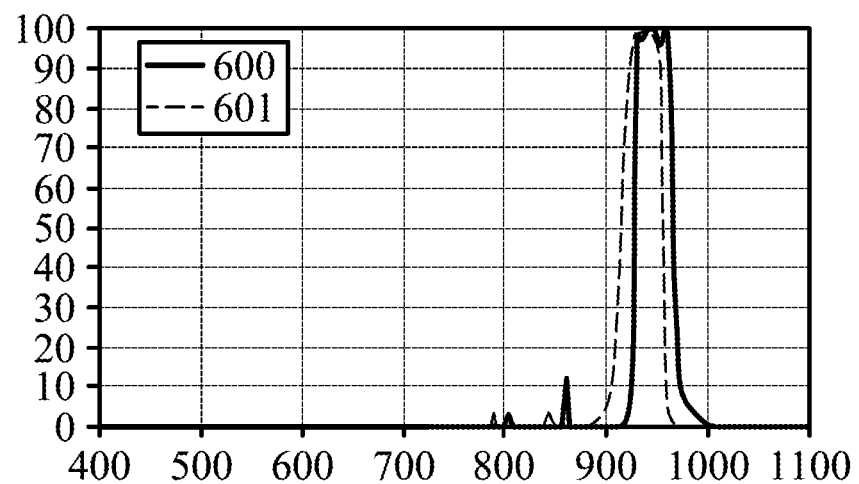
FIG. 6 shows transmittance spectra at incidence angles of 0° and 31° of an optical filter according to a comparative embodiment of the present disclosure.
Figure 7:
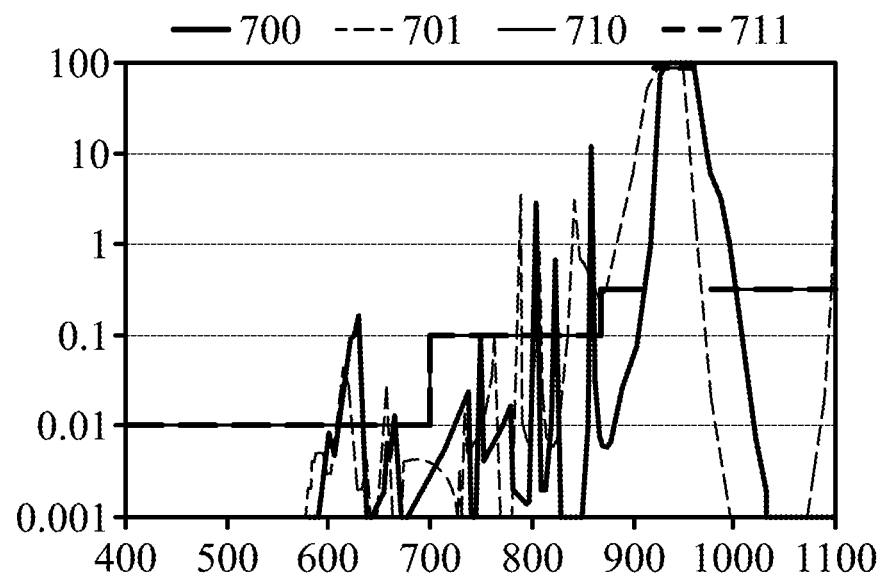
FIG. 7 shows the transmittance spectra of FIG. 6 with logarithmic y-axis.

FIG. 4 shows transmittance spectra at incidence angles of 0° and 31° of an optical filter according to an embodiment of the present disclosure, and FIG. 5 shows the transmittance spectra of FIG. 4 with logarithmic y-axis. FIG. 6 shows transmittance spectra at incidence angles of 0° and 31° of an optical filter according to a comparative embodiment of the present disclosure, and FIG. 7 shows the transmittance spectra of FIG. 6 with logarithmic y-axis. The results of transmittance spectra presented in the present disclosure were simulated using Essential Macleod commercial software package.

Referring to FIGS. 4-7, the optical filters of Embodiment 1 and Comparative embodiment 1 are narrow bandpass filters designed to transmit a light in a wavelength range of 931 nm to 961 nm over an incident angle range of 0° to 31°. The layer numbers (from air to the substrate), materials, and the thicknesses of the layers of the optical filters of Embodiment 1 and Comparative embodiment 1 are listed in table 1 and table 2, respectively. The filter stacks of the optical filter of Embodiment 1 include 66 layers with a total thickness of about 4.6 μm. The filter stacks of the optical filter of Comparative embodiment 1 include 41 layers with a total thickness of about 6.6 μm.

In some embodiments, a hydrogenated silicon (SiH) layer having a refractive index of 3.514 at a wavelength of 940 nm may be formed by sputtering deposition, the sputtering deposition is performed with an argon flow rate of about 225 sccm and a hydrogen gas flow rate of a plasma-activated hydrogen gas of about 150 sccm, and a sputtering target power of about 8 kW is applied to sputter a silicon target. In some embodiments, a hydrogenated silicon (SiH) layer having a refractive index of 3.206 at a wavelength of 940 nm may be formed by sputtering deposition, the sputtering deposition is performed with an argon flow rate of about 170 sccm and a hydrogen gas flow rate of a plasma-activated hydrogen gas of about 150 sccm, and a sputtering target power of about 6 kW is applied to sputter a silicon target.

In tables 1 and 2, a SiH layer having refractive index of 3.51 (SiH-2) at a wavelength of 940 nm, a SiH layer having refractive index of 3.16 (SiH-1) at a wavelength of 940 nm, and $SiO_2$ layer having refractive index of 1.45 at a wavelength of 940 nm are adopted for simulation.

TABLE 1

(Embodiment 1)

| Layer No. | Material | Thickness (nm) |
|---|---|---|
| 0 | Air | N/A |
| 1 | $SiO_2$ | 297.97 |
| 2 | SiH-1 | 20.02 |
| 3 | SiH-2 | 21.94 |
| 4 | $SiO_2$ | 81.63 |
| 5 | SiH-1 | 109.84 |
| 6 | SiH-2 | 73.1 |
| 7 | $SiO_2$ | 140.16 |
| 8 | SiH-1 | 16.28 |
| 9 | SiH-2 | 62.08 |
| 10 | $SiO_2$ | 164.32 |
| 11 | SiH-1 | 75.58 |

TABLE 1-continued (Embodiment 1)

| Layer No. | Material | Thickness (nm) |
|---|---|---|
| 12 | SiH-2 | 89.43 |
| 13 | SiO$_2$ | 54.61 |
| 14 | SiH-1 | 37.82 |
| 15 | SiH-2 | 62.63 |
| 16 | SiO$_2$ | 69.6 |
| 17 | SiH-1 | 20.78 |
| 18 | SiH-2 | 57.91 |
| 19 | SiO$_2$ | 96.77 |
| 20 | SiH-1 | 39.06 |
| 21 | SiH-2 | 64.49 |
| 22 | SiO$_2$ | 52.46 |
| 23 | SiH-1 | 15.05 |
| 24 | SiH-2 | 52.08 |
| 25 | SiO$_2$ | 10.01 |
| 26 | SiH-1 | 48.97 |
| 27 | SiH-2 | 47.53 |
| 28 | SiO$_2$ | 42.8 |
| 29 | SiH-1 | 53.97 |
| 30 | SiH-2 | 64.58 |
| 31 | SiO$_2$ | 116.99 |
| 32 | SiH-1 | 30.04 |
| 33 | SiH-2 | 64.93 |
| 34 | SiO$_2$ | 94.41 |
| 35 | SiH-1 | 72 |
| 36 | SiH-2 | 67.51 |
| 37 | SiO$_2$ | 10.21 |
| 38 | SiH-1 | 73.41 |
| 39 | SiH-2 | 58.5 |
| 40 | SiO$_2$ | 29.54 |
| 41 | SiH-1 | 94.83 |
| 42 | SiH-2 | 70.41 |
| 43 | SiO$_2$ | 10.88 |
| 44 | SiH-1 | 78.66 |
| 45 | SiH-2 | 53.98 |
| 46 | SiO$_2$ | 45.86 |
| 47 | SiH-1 | 75.02 |
| 48 | SiH-2 | 76.77 |
| 49 | SiO$_2$ | 92.25 |
| 50 | SiH-1 | 14.84 |
| 51 | SiH-2 | 51.43 |
| 52 | SiO$_2$ | 108.61 |
| 53 | SiH-1 | 56.68 |
| 54 | SiH-2 | 78.34 |
| 55 | SiO$_2$ | 115.49 |
| 56 | SiH-1 | 81.15 |
| 57 | SiH-2 | 64.44 |
| 58 | SiO$_2$ | 73.67 |
| 59 | SiH-1 | 55.73 |
| 60 | SiH-2 | 62.24 |
| 61 | SiO$_2$ | 132.02 |
| 62 | SiH-1 | 31.73 |
| 63 | SiH-2 | 30.92 |
| 64 | SiO$_2$ | 329.99 |
| 65 | SiH-1 | 79.7 |
| 66 | SiH-2 | 10.21 |
| Substrate | glass | N/A |

TABLE 2

(Comparative embodiment 1)

| Layer No. | Material | Thickness (nm) |
|---|---|---|
| 0 | Air | N/A |
| 1 | SiO$_2$ | 377.02 |
| 2 | SiH-2 | 47.8 |
| 3 | SiO$_2$ | 382.67 |
| 4 | SiH-2 | 51.31 |
| 5 | SiO$_2$ | 192.29 |
| 6 | SiH-2 | 46.42 |
| 7 | SiO$_2$ | 721.98 |

TABLE 2-continued (Comparative embodiment 1)

| Layer No. | Material | Thickness (nm) |
|---|---|---|
| 8 | SiH-2 | 51.55 |
| 9 | SiO$_2$ | 170.64 |
| 10 | SiH-2 | 249.04 |
| 11 | SiO$_2$ | 82.36 |
| 12 | SiH-2 | 165.32 |
| 13 | SiO$_2$ | 5.58 |
| 14 | SiH-2 | 157.35 |
| 15 | SiO$_2$ | 97.37 |
| 16 | SiH-2 | 247.67 |
| 17 | SiO$_2$ | 129.09 |
| 18 | SiH-2 | 263.16 |
| 19 | SiO$_2$ | 42.16 |
| 20 | SiH-2 | 165.96 |
| 21 | SiO$_2$ | 48.16 |
| 22 | SiH-2 | 298.81 |
| 23 | SiO$_2$ | 105.38 |
| 24 | SiH-2 | 265.63 |
| 25 | SiO$_2$ | 134.9 |
| 26 | SiH-2 | 239.32 |
| 27 | SiO$_2$ | 134.99 |
| 28 | SiH-2 | 14.41 |
| 29 | SiO$_2$ | 111.71 |
| 30 | SiH-2 | 84.34 |
| 31 | SiO$_2$ | 205.97 |
| 32 | SiH-2 | 21.55 |
| 33 | SiO$_2$ | 177.71 |
| 34 | SiH-2 | 34.55 |
| 35 | SiO$_2$ | 391.54 |
| 36 | SiH-2 | 58.22 |
| 37 | SiO$_2$ | 193.41 |
| 38 | SiH-2 | 173.84 |
| 39 | SiO$_2$ | 64.1 |
| 40 | SiH-2 | 59.34 |
| 41 | SiO$_2$ | 93.77 |
| Substrate | glass | N/A |

The transmittance properties with respect to different wavelength ranges of the simulated results as shown in FIGS. 4-7 are summarized in table 3 and table 4 for Embodiment 1 and Comparative embodiment 1, respectively. In the tables below, simulated results from the present disclosure and requirements from industry of average transmittance, maximum transmittance, and minimum transmittance of lights in different predetermined wavelength ranges are listed. For example, "avg(400-700)" indicates an average transmittance (%) of light in a wavelength range of 400 nm to 700 nm, "max(400-700)" indicates a maximum transmittance (%) of light in a wavelength range of 400 nm to 700 nm, and "min(400-700)" indicates a minimum transmittance (%) of light in a wavelength range of 400 nm to 700 nm.

TABLE 3

(Embodiment 1)

| | Incidence angle of 0° | | Incidence angle of 31° | |
|---|---|---|---|---|
| | Requirement | Simulated result | Requirement | Simulated result |
| avg(400-700) | 0.001 | 0.0046 | 0.001 | 0.0071 |
| max(400-700) | 0.01 | 0.11 | 0.01 | 0.20 |
| avg(700-870) | 0.01 | 0.01 | 0.01 | 0.01 |
| max(700-870) | 0.1 | 0.18 | 0.1 | 0.41 |
| avg(870-896) | — | — | 0.1 | 0.14 |
| max(870-896) | — | — | 0.32 | 0.87 |
| avg(870-909) | 0.1 | 0.00 | — | — |
| max(870-909) | 0.32 | 0.02 | — | — |
| avg(924-948) | — | — | 95 | 98.39 |
| min(922-950) | — | — | 90 | 91.54 |

TABLE 3-continued (Embodiment 1)

| | Incidence angle of 0° | | Incidence angle of 31° | |
|---|---|---|---|---|
| | Requirement | Simulated result | Requirement | Simulated result |
| avg(931-961) | 95 | 99.22 | — | — |
| min(931-961) | 90 | 96.92 | — | — |
| avg(980-1100) | — | — | 0.1 | 0.00 |
| max(980-1100) | — | — | 0.32 | 0.02 |
| avg(990-1100) | 0.1 | 0.01 | — | — |
| max(990-1100) | 0.32 | 0.17 | — | — |

TABLE 4

(Comparative embodiment 1)

| | Incidence angle of 0° | | Incidence angle of 31° | |
|---|---|---|---|---|
| | Requirement | Simulated result | Requirement | Simulated result |
| avg(400-700) | 0.001 | 0.0065 | 0.001 | 0.0027 |
| max(400-700) | 0.01 | 0.15 | 0.01 | 0.04 |
| avg(700-870) | 0.01 | 0.19 | 0.01 | 0.22 |
| max(700-870) | 0.1 | 11.87 | 0.1 | 3.15 |
| avg(870-896) | — | — | 0.1 | 1.25 |
| max(870-896) | — | — | 0.32 | 3.54 |
| avg(870-909) | 0.1 | 0.03 | — | — |
| max(870-909) | 0.32 | 0.13 | — | — |
| avg(924-948) | — | — | 95 | 97.89 |
| min(922-950) | — | — | 90 | 84.08 |
| avg(931-961) | 95 | 98.06 | — | — |
| min(931-961) | 90 | 95.28 | — | — |
| avg(980-1100) | — | — | 0.1 | 0.82 |
| max(980-1100) | — | — | 0.32 | 48.30 |
| avg(990-1100) | 0.1 | 0.14 | — | — |
| max(990-1100) | 0.32 | 2.22 | — | — |

FIG. 4 shows transmission spectra 400 and 401 at incidence angles of 0° and 31° of Embodiment 1, respectively. Referring to FIG. 5, transmittance spectra 500 and 501 represent transmission spectra 400 and 401 with logarithmic y-axis, respectively, and transmittance spectra 510 and 511 represent industrial requirements respectively corresponding to transmittance spectra 500 and 501. Similarly, FIG. 6 shows transmission spectra 600 and 601 at incidence angles of 0° and 31° of Comparative embodiment 1, respectively. Referring to FIG. 7, transmittance spectra 700 and 701 represent transmission spectra 600 and 601 with logarithmic y-axis, respectively, and transmittance spectra 710 and 711 represent industrial requirements respectively corresponding to transmittance spectra 700 and 701.

As shown in FIGS. 6-7 and table 4, the optical filter of Comparative embodiment 1 has a transmittance level within the wavelength range of 931 nm to 961 nm that is lower than 95.5% at an incidence angle of 0°. In addition, at an incidence angle of 31° with the wavelength range shifted to about 922 nm to about 950 nm, the optical filter of Comparative embodiment 1 has a relatively low transmittance level of only 84.08%. Moreover, the optical filter of Comparative embodiment 1 has a blocking level of 11.87% within a wavelength range of 700 nm to 870 nm at an incidence angle of 0°, and a blocking level of 3.54% within a shifted wavelength range of 870 nm to 896 nm at an incidence angle of 31°. In addition, the optical filter of Comparative embodiment 1 has a blocking level of 2.22% within a wavelength range of 990 nm to 1100 nm at an incidence angle of 0°, and a blocking level of 48.30% within a shifted wavelength range of 980 nm to 1100 nm at an incidence angle of 31°. In view of the above, the optical filter of Comparative embodiment 1 not only has a higher total thickness than that of the optical filter of Embodiment 1, but it also has an undesired high angle dependency and poor blocking level.

On the contrary, as shown in FIGS. 4-5 and table 3, the optical filter of Embodiment 1 has an average transmittance of 99.22% and a minimum transmittance of 96.92% within the wavelength range of 931 nm to 961 nm at an incidence angle of 0°. That is, the optical filter of Embodiment 1 has a transmittance level within the wavelength range of 931 nm to 961 nm of greater than 96%. In addition, even at an incidence angle of 31° with the wavelength range shifted to about 922 nm to about 950 nm, the optical filter of Embodiment 1 still has a transmittance level of greater than 91%. Moreover, the optical filter of Embodiment 1 has a blocking level of greater than OD3 outside of the above-mentioned wavelength range.

Moreover, as shown in FIGS. 4-5, the center wavelength of the passband shift (i.e. blue shift) of the optical filter of Embodiment 1 is less than 13 nm with a change of an incidence angle from 0° to 31°. In addition, the transmittance of the optical filter of Embodiment 1 can be raised from 10% to 90% within a relatively small wavelength range (e.g. 924 nm to 930 nm) of less than 6 nm. As such, an excellent signal-to-noise ratio can be provided by the optical filter in accordance with the embodiments of the present disclosure.

Figure 8:
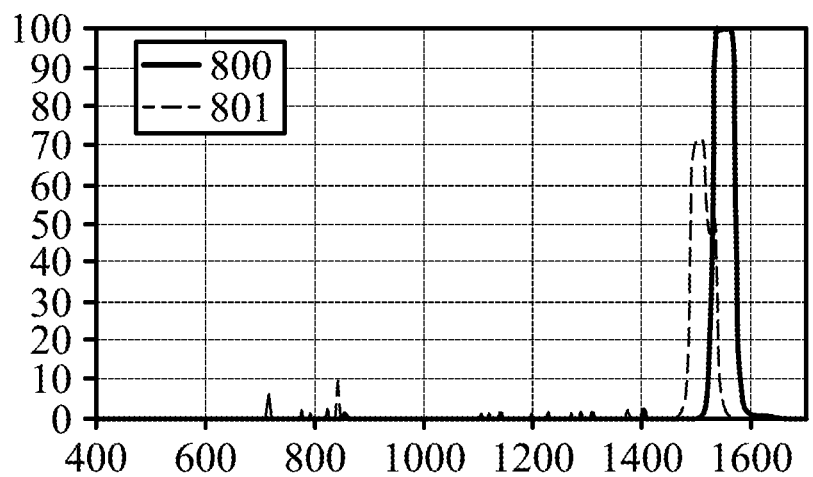
FIG. 8 shows transmittance spectra at incidence angles of 0° and 310 of an optical filter according to another embodiment of the present disclosure.
Figure 9:
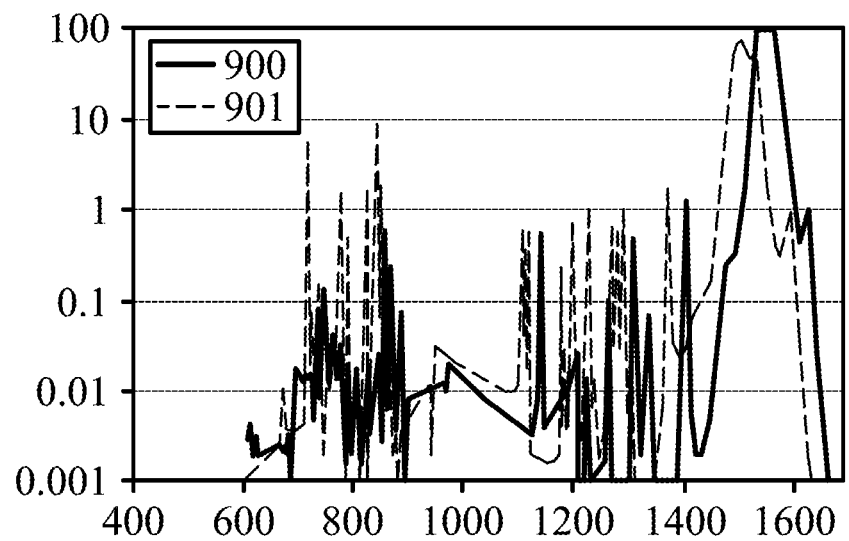
FIG. 9 shows the transmittance spectra of FIG. 8 with logarithmic y-axis.

FIG. 8 shows transmittance spectra at incidence angles of 0° and 310 of an optical filter according to another embodiment of the present disclosure, and FIG. 9 shows the transmittance spectra of FIG. 8 with logarithmic y-axis.

Referring to FIGS. 8-9, the optical filter of Embodiment 2 is a narrow bandpass filter designed to transmit alight in a wavelength range of 1535 nm to 1565 nm over an incident angle range of 0° to 310°. The layer numbers (from air to the substrate), materials, and the thicknesses of the layers of the optical filter of Embodiment 2 are listed in table 5. The filter stacks of the optical filter of Embodiment 2 include 84 layers with a total thickness of about 9.15 μm.

In table 5, SiH layer having refractive index of 3.51 (SiH-2) at a wavelength of 940 nm, a SiH layer having refractive index of 3.16 (SiH-1) at a wavelength of 940 nm, and $Si_2$ layer having refractive index of 1.45 at a wavelength of 940 nm are adopted for simulation.

TABLE 5

(Embodiment 2)

| Layer No. | Material | Thickness (nm) |
|---|---|---|
| 0 | Air | N/A |
| 1 | $SiO_2$ | 496.81 |
| 2 | SiH-1 | 32.8 |
| 3 | SiH-2 | 37.6 |
| 4 | $SiO_2$ | 122.33 |
| 5 | SiH-1 | 196.76 |
| 6 | SiH-2 | 128.62 |
| 7 | $SiO_2$ | 252.39 |
| 8 | SiH-1 | 26.71 |
| 9 | SiH-2 | 103.07 |
| 10 | $SiO_2$ | 263.06 |
| 11 | SiH-1 | 130.71 |
| 12 | SiH-2 | 152.21 |
| 13 | $SiO_2$ | 80.35 |
| 14 | SiH-1 | 62.38 |
| 15 | SiH-2 | 103.9 |

TABLE 5-continued (Embodiment 2)

| Layer No. | Material | Thickness (nm) |
|---|---|---|
| 16 | SiO₂ | 102.53 |
| 17 | SiH-1 | 47.25 |
| 18 | SiH-2 | 146.25 |
| 19 | SiO₂ | 154.17 |
| 20 | SiH-1 | 57.05 |
| 21 | SiH-2 | 107.21 |
| 22 | SiO₂ | 78.48 |
| 23 | SiH-1 | 21.45 |
| 24 | SiH-2 | 88.57 |
| 25 | SiO₂ | 15.95 |
| 26 | SiH-1 | 86.5 |
| 27 | SiH-2 | 83.85 |
| 28 | SiO₂ | 140.2 |
| 29 | SiH-1 | 96.49 |
| 30 | SiH-2 | 103.95 |
| 31 | SiO₂ | 186.95 |
| 32 | SiH-1 | 59.8 |
| 33 | SiH-2 | 154.9 |
| 34 | SiO₂ | 133.8 |
| 35 | SiH-1 | 120.18 |
| 36 | SiH-2 | 121.73 |
| 37 | SiO₂ | 14.11 |
| 38 | SiH-1 | 119.38 |
| 39 | SiH-2 | 101.41 |
| 40 | SiO₂ | 49.31 |
| 41 | SiH-1 | 154.17 |
| 42 | SiH-2 | 116.6 |
| 43 | SiO₂ | 38.88 |
| 44 | SiH-1 | 128.36 |
| 45 | SiH-2 | 89.74 |
| 46 | SiO₂ | 76 |
| 47 | SiH-1 | 126.12 |
| 48 | SiH-2 | 123.02 |
| 49 | SiO₂ | 145.2 |
| 50 | SiH-1 | 33.67 |
| 51 | SiH-2 | 82.39 |
| 52 | SiO₂ | 169.68 |
| 53 | SiH-1 | 95.99 |
| 54 | SiH-2 | 127.35 |
| 55 | SiO₂ | 168.2 |
| 56 | SiH-1 | 133.16 |
| 57 | SiH-2 | 105.28 |
| 58 | SiO₂ | 122.46 |
| 59 | SiH-1 | 97.47 |
| 60 | SiH-2 | 106.66 |
| 61 | SiO₂ | 195.31 |
| 62 | SiH-1 | 53.76 |
| 63 | SiH-2 | 52.24 |
| 64 | SiO₂ | 516.1 |
| 65 | SiH-1 | 134.21 |
| 66 | SiH-2 | 12.06 |
| 67 | SiO₂ | 132.5 |
| 68 | SiH-1 | 39.9 |
| 69 | SiH-2 | 46.18 |
| 70 | SiO₂ | 89 |
| 71 | SiH-1 | 43.23 |
| 72 | SiH-2 | 44.49 |
| 73 | SiO₂ | 156.97 |
| 74 | SiH-1 | 47.49 |
| 75 | SiH-2 | 51.33 |
| 76 | SiO₂ | 153.11 |
| 77 | SiH-1 | 51.62 |
| 78 | SiH-2 | 65.14 |
| 79 | SiO₂ | 155.75 |
| 80 | SiH-1 | 40.99 |
| 81 | SiH-2 | 38.02 |
| 82 | SiO₂ | 107.16 |
| 83 | SiH-1 | 63.91 |
| 84 | SiH-2 | 33.5 |
| Substrate | glass | N/A |

FIG. 8 shows transmission spectra 800 and 801 at incidence angles of 0° and 31° of Embodiment 2, respectively.

Referring to FIG. 9, transmittance spectra 900 and 901 represent transmission spectra 800 and 801 with logarithmic y-axis, respectively.

As shown in FIGS. 8-9, the optical filter of Embodiment 2 has a transmittance level within the wavelength range of 1520 nm to 1550 nm of greater than 95% at an incident angle range of 0°. In addition, as shown in FIG. 9, the optical filter of Embodiment 2 has a blocking level of greater than OD3 outside of the above-mentioned wavelength range.

Moreover, as shown in FIGS. 8-9, the transmittance of the optical filter of Embodiment 2 can be raised from 10% to 90% within a wavelength range (e.g. 1535 nm to 1565 nm) of less than 10 nm. As such, an excellent signal-to-noise ratio can be provided by the optical filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical filter, comprising:
   a substrate; and
   a plurality of filter stacks formed on the substrate,
   wherein each of the plurality of filter stacks comprises:
   a higher-refractive-index layer having a first refractive index of higher than 3.5;
   a medium-refractive-index layer disposed on the higher-refractive-index layer, wherein the medium-refractive-index layer has a second refractive index higher than 2.9 and lower than the first refractive index; and
   a lower-refractive-index layer disposed on the medium-refractive-index layer, wherein the lower-refractive-index layer has a third refractive index lower than the second refractive index,
   wherein the medium-refractive-index layer comprises hydrogenated silicon.

2. The optical filter as claimed in claim 1, wherein the medium-refractive-index layer is disposed between and in direct contact with the higher-refractive-index layer and the lower-refractive-index layer in each of the plurality of filter stacks.

3. The optical filter as claimed in claim 1, wherein the second refractive index is in a range from about 2.9 to about 3.3.

4. The optical filter as claimed in claim 1, wherein the third refractive index is lower than 1.6.

5. The optical filter as claimed in claim 1, wherein a difference between the second refractive index and the third refractive index is greater than a difference between the first refractive index and the second refractive index.

6. The optical filter as claimed in claim 1, wherein a total thickness of the plurality of filter stacks is less than 5 μm.

7. The optical filter as claimed in claim 1, wherein the substrate is in direct contact with the higher-refractive-index layer of one of the plurality of filter stacks.

8. The optical filter as claimed in claim 1, wherein the higher-refractive-index layer and the medium-refractive-index layer comprise hydrogenated silicon (SiH), and the lower-refractive-index layer comprises silicon oxide.

9. A method for forming an optical filter, comprising:
providing a substrate; and
providing a plurality of filter stacks on the substrate,
wherein providing each of the plurality of filter stacks comprises:
providing a higher-refractive-index layer having a first refractive index of higher than 3.5;
providing a medium-refractive-index layer on the higher-refractive-index layer, wherein the medium-refractive-index layer has a second refractive index higher than 2.9 and lower than the first refractive index; and
providing a lower-refractive-index layer on the medium-refractive-index layer, wherein the lower-refractive-index layer has a third refractive index lower than the second refractive index,
wherein the medium-refractive-index layer comprises hydrogenated silicon.

10. The method for forming the optical filter as claimed in claim 9, wherein providing the higher-refractive-index layer, providing the medium-refractive-index layer and providing the lower-refractive-index layer of each of the plurality of filter stacks are performed by sputtering deposition.

11. The method for forming the optical filter as claimed in claim 10, wherein the higher-refractive-index layer of one of the plurality of filter stacks is deposited on and in direct contact with the substrate.

12. The method for forming the optical filter as claimed in claim 10, wherein providing the higher-refractive-index layer, providing the medium-refractive-index layer and providing the lower-refractive-index layer of each of the plurality of filter stacks independently comprise:
providing a target material inside a sputtering deposition chamber, the target material comprising niobium, titanium, tantalum, silicon, yttrium, zirconium, aluminum, copper, amorphous silicon, crystalline silicon, silver, gold, germanium, or any combination thereof; and
supplying a plasma-activated reactive gas to sputter the target material, the plasma-activated reactive gas comprising: hydrogen, oxygen, nitrogen, or any combination thereof.

13. The method for forming the optical filter as claimed in claim 12, wherein providing the higher-refractive-index layer, providing the medium-refractive-index layer and providing the lower-refractive-index layer of each of the plurality of filter stacks are performed in-situ in the same sputtering deposition chamber.

14. The method for forming the optical filter as claimed in claim 10, wherein providing the higher-refractive-index layer and providing the medium-refractive-index layer of each of the plurality of filter stacks independently comprise:
supplying an inert gas at an inert gas flow rate of about 50 sccm to about 450 sccm; and
supplying a plasma-activated hydrogen gas at a hydrogen gas flow rate of greater than about 0 sccm to about 150 sccm to sputter a silicon target with a sputtering target power of about 6 kW to about 8 kW to deposit the higher-refractive-index layer.

15. The method for forming the optical filter as claimed in claim 10, wherein a sputtering target power for providing the higher-refractive-index layer is higher than a sputtering target power for providing the medium-refractive-index layer.

16. The method for forming the optical filter as claimed in claim 10, wherein an inert gas flow rate used in providing the higher-refractive-index layer is higher than an inert gas flow rate used in providing the medium-refractive-index layer.

17. The method for forming the optical filter as claimed in claim 10, wherein providing the lower-refractive-index layer comprises:
supplying an inert gas at an inert gas flow rate of about 50 sccm to about 450 sccm; and
supplying a plasma-activated oxygen gas at an oxygen flow rate of about 150 sccm to about 350 sccm to sputter a silicon target with a sputtering target power of about 6 kW to about 8 kW to deposit the lower-refractive-index layer.

18. The method for forming the optical filter as claimed in claim 9, wherein the medium-refractive-index layer is in direct contact with the higher-refractive-index layer and the lower-refractive-index layer in each of the plurality of filter stacks.

19. The method for forming the optical filter as claimed in claim 9, wherein the second refractive index is in a range from about 2.9 to about 3.3, and the third refractive index is lower than 1.6.

* * * * *